United States Patent [19]

Gonzalez

[11] Patent Number: 5,439,835
[45] Date of Patent: Aug. 8, 1995

[54] PROCESS FOR DRAM INCORPORATING A HIGH-ENERGY, OBLIQUE P-TYPE IMPLANT FOR BOTH FIELD ISOLATION AND PUNCHTHROUGH

[75] Inventor: Fernando Gonzalez, Boise, Id.

[73] Assignee: Micron Semiconductor, Inc., Boise, Id.

[21] Appl. No.: 324,277

[22] Filed: Oct. 14, 1994

Related U.S. Application Data

[63] Continuation-in-part of Ser. No. 152,116, Nov. 12, 1993, Pat. No. 5,376,566.

[51] Int. Cl.⁶ .......................................... H01L 21/265
[52] U.S. Cl. ...................................... 437/35; 437/52; 437/60; 437/44; 437/27; 437/919
[58] Field of Search .............. 437/35, 52, 60, 919, 437/44, 27

[56] References Cited

U.S. PATENT DOCUMENTS

| | | | |
|---|---|---|---|
| 5,198,386 | 3/1993 | Gonzalez | 437/52 |
| 5,217,910 | 6/1993 | Shimizu et al. | 437/35 |
| 5,245,208 | 9/1993 | Eimori | 257/344 |
| 5,250,449 | 10/1993 | Kuroyanagi et al. | 437/27 |
| 5,292,674 | 3/1994 | Okabe et al. | 437/44 |
| 5,312,768 | 5/1994 | Gonzalez | 437/40 |
| 5,334,547 | 8/1994 | Nakamura | 437/35 |
| 5,338,955 | 8/1994 | Tamura et al. | 257/306 |
| 5,376,566 | 12/1994 | Gonzalez | 437/35 |

FOREIGN PATENT DOCUMENTS

| | | | |
|---|---|---|---|
| 2113474 | 5/1987 | Japan | 437/35 |
| 3262130 | 11/1991 | Japan | 437/35 |
| 0536719 | 2/1993 | Japan | 437/35 |

OTHER PUBLICATIONS

Hori et al., "Deep–Submicrometer Large–Angle–Tilt Implanted Drain (LATID) Technology" IEEE Transactions on Electron Devices, vol. 39, No. 10, Oct. 1992.
A New Subicron MOSFET with LATID (Large-Tilt Angle Implanted Drain) Structure Takashi Hori, Kazumi Kurimoto, Toshiki, Yabu, and Genshu Fuse pp. 15 & 16.
Mechanism Analysis of a Highly Reliable Graded Junction Gate/N Overlapped Structure in MOS LDD Transistor Y. Okumura, T. Kunikiyo, I Ogoh, H. Genjo, M. Inuishi, M. Nagatomo and T. Matsukawa, pp. 477–480, 1989.
Angled Implant Fully Overlapped LDD (AI–Fold) NFET's for Performance and Reliability. A Bryant, T. Furukawa, J. Mandelman, S. Mittl, W. Noble, E. Nowak, W. Wade, S. Ogura & M. Wordeman. pp. 152–157. 1989.

(List continued on next page.)

Primary Examiner—Brian E. Hearn
Assistant Examiner—Lynne A. Gurley

[57] ABSTRACT

This invention is a process for fabricating a CMOS dynamic random access memory (DRAM) wherein a high-energy, oblique P-type implant is employed for punchthrough protection and field isolation enhancement or alternatively for punchthrough protection and as the sole field isolation implant. The process proceeds by forming P-type and N-type regions in a silicon substrate, performing an optional field isolation implant and forming field isolation regions using LOCOS or a modified LOCOS sequence, forming a gate dielectric layer, forming wordlines, depositing an offsetting dielectric layer, performing a low-dosage N-type implant in N-channel source/drain regions, forming spacers on the sidewalls of the gate electrodes, constructing cell capacitors superjacent the storage-node regions, performing a high-energy oblique implant with a P-type impurity which penetrates the spacers and field oxide layers, and performing a high-dosage N-type implant in bitline contact regions. As an option, the angle of the P-type oblique implant is varied through a given range to create an anti-punchthrough halo having a graded density. As a further option, a lower energy oblique implant may be performed with an N-type implant to create a graded junction for bitline junction region.

15 Claims, 7 Drawing Sheets

OTHER PUBLICATIONS

Drain-Structure Design for Reduced Band-to Band and Band-to-Defect Tunneling Leakage. Takashi Hor. pp. 69-70. 1990.

SCC (Scurrounded Capacitor Cell) Structure for DRAM. G. Fuse, K. Tateiwa, S. Odanaka, T. Yamada, I. Nakao, H. Shimoda, O. Shippou, M. Fukumoto, J. Yasui, Y. Naito, and T. Ohzone. pp. 11-14. 1987.

¼-PM LATID (Large-Tilt-angle Implanted Drain) Technlogy for 3.3-V Operation. Takashi Horo. pp. 32.4.1-32.4.4. 1989.

Deep-Submicrometer Large-Angle-Tilt Implanted Drain (LATID) Technology Takashi Hori, Junji Hirase, Yoshinori Odake & Takatoshi Yasui. pp. 2313-2324. 1992.

Optimum Design of Gate/N Overlapped LDD Transistor. M. Inuishi, K. Mitsui, S. Komori, M. Shimizu, H. Oda, J. Mitsuhashi & K. Tsukamoto. pp. 4-4-4-5.

A New MOSFET with Large-Tilt-Angle Implanted Drain (LATID) Structure. Takashi Hori, Kazumi Kurimoto 1988.

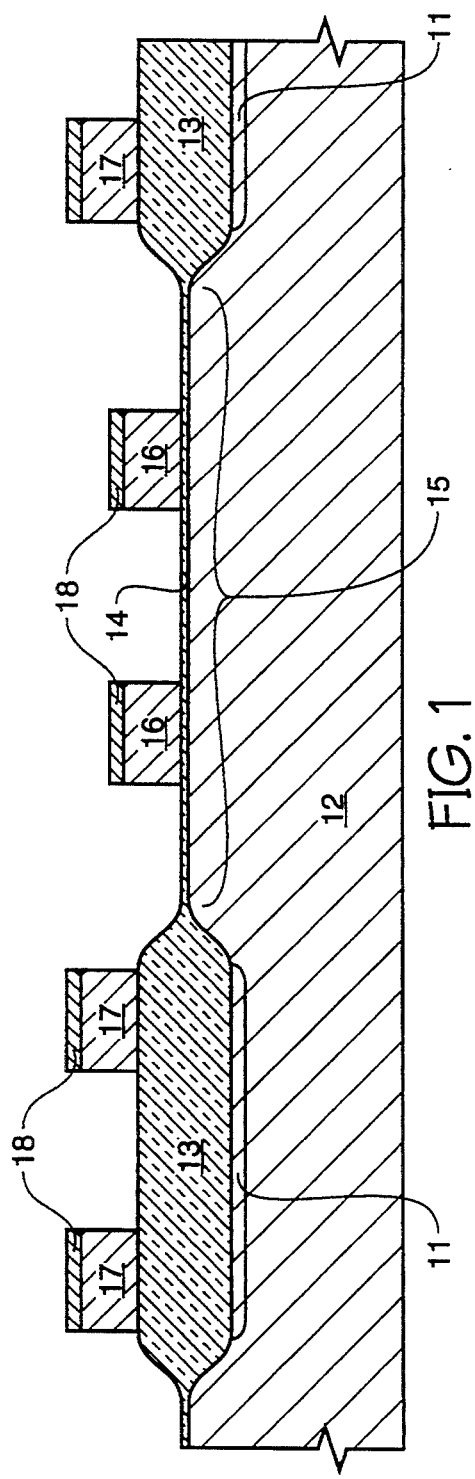
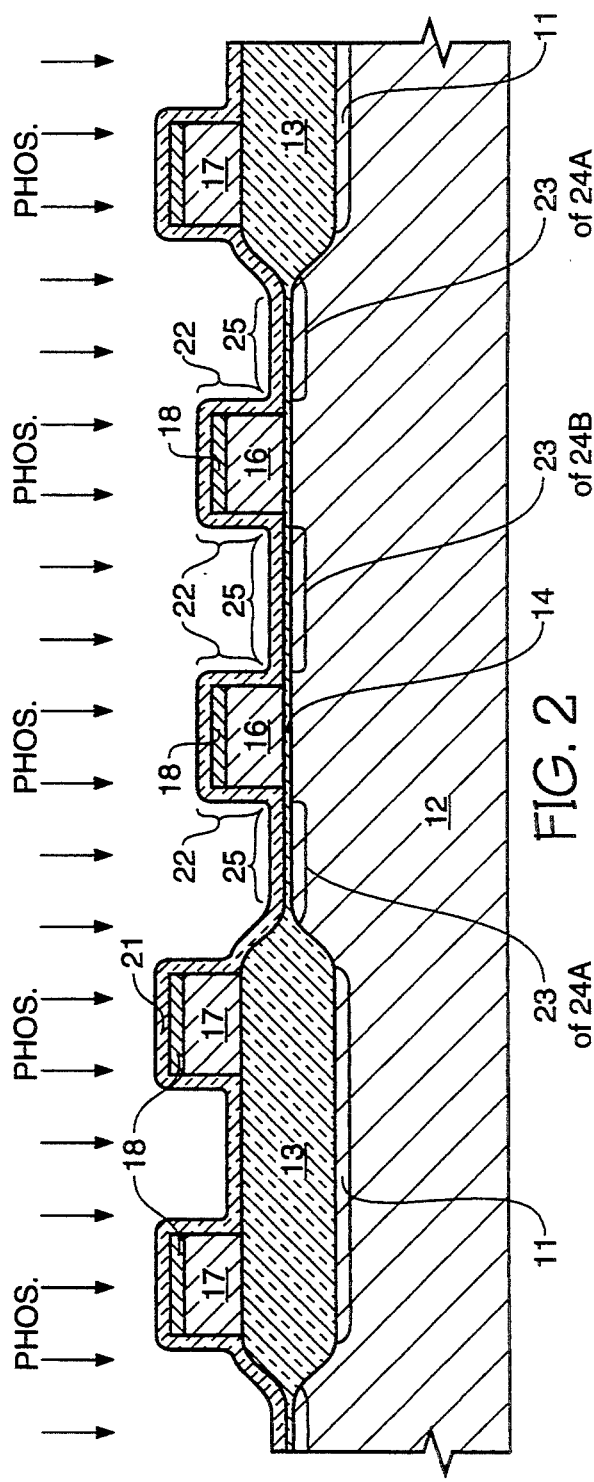

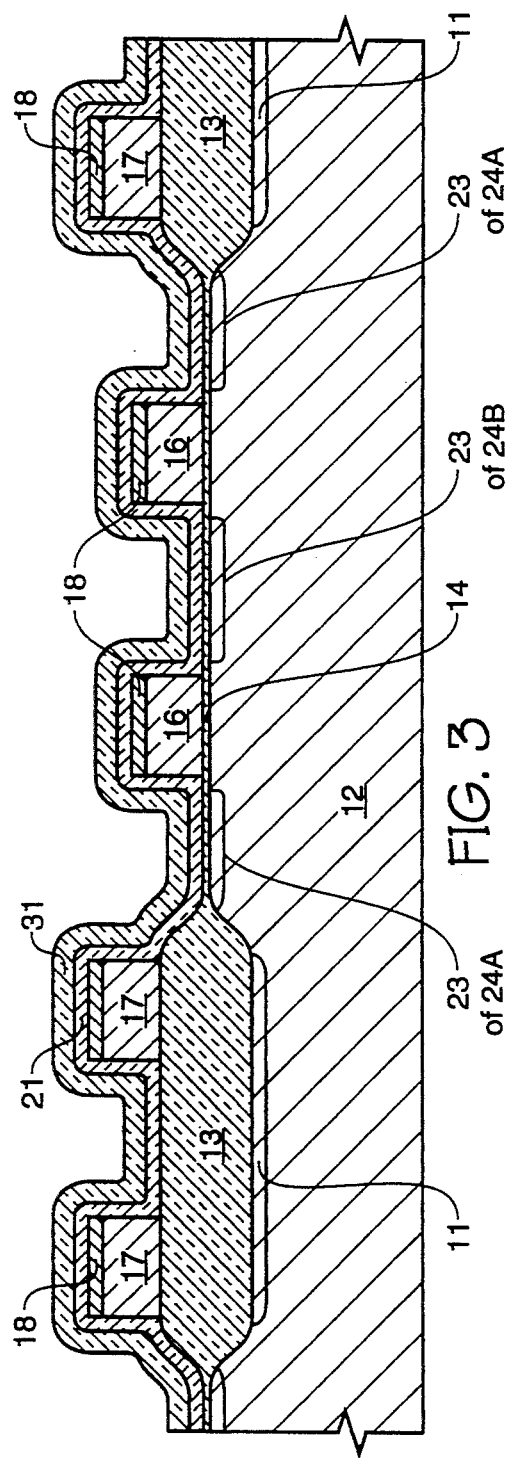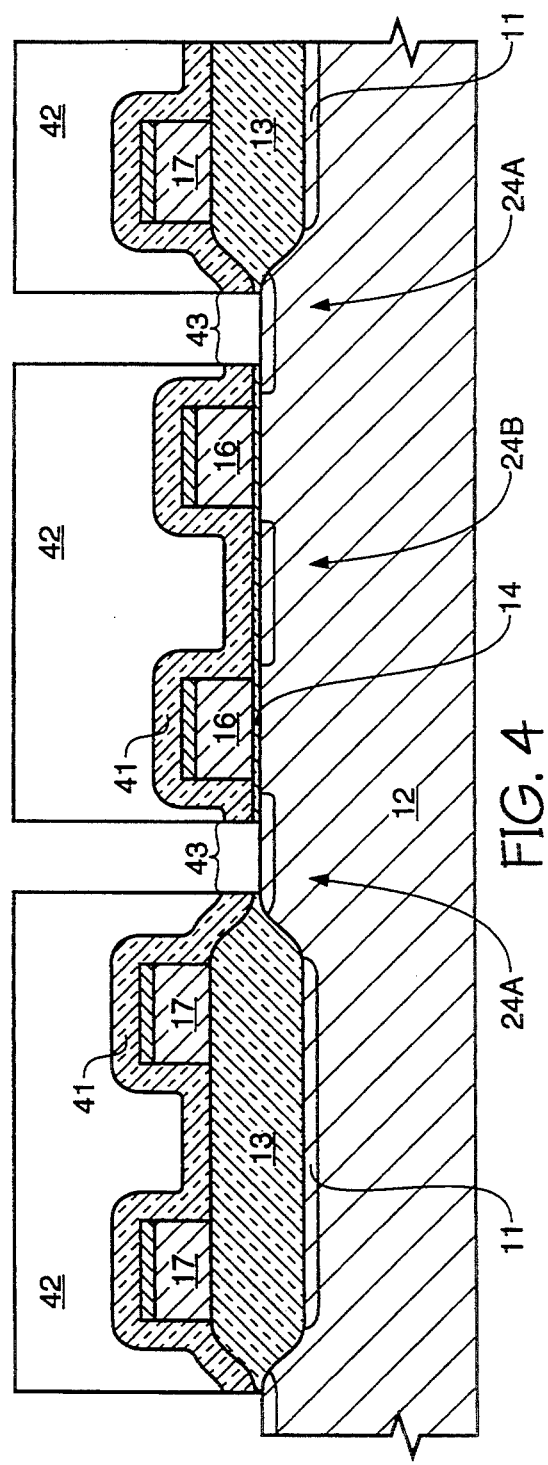

PROCESS FOR DRAM INCORPORATING A HIGH-ENERGY, OBLIQUE P-TYPE IMPLANT FOR BOTH FIELD ISOLATION AND PUNCHTHROUGH

This is a continuation in part of application Ser. No. 08/152,116, filed on Nov. 12, 1993 which is now U.S. Pat. No. 5,376,566.

FIELD OF THE INVENTION

This invention relates to the use of oblique (angled) implants and asymmetrical access transistors in the fabrication of a dynamic random access memory (DRAM) and, more particularly, to the use of an unmasked, high-energy oblique P-type implant which serves both as a field implant and as a anti-punchthrough implant.

BACKGROUND OF THE INVENTION

As field effect transistors have been scaled down to submicron levels, short-channel effects have become a major concern. Punchthrough, which is defined as current leakage through the channel of a field-effect transistor when the gate voltage is coupled to the source, is one such short-channel effect. In order to mitigate the punchthrough phenomenon, the transistor channel is implanted with an impurity that is of the opposite conduction type as that implanted in the source and drain regions. For example, boron or boron compounds are typically implanted into the channels of N-channel devices, while phosphorus is typically implanted into the channels of P-channel devices.

A simple method for dealing with the punchthrough problem calls for the implanting of boron, at an energy of about 50 kev and a dosage of about 4E12, into active areas following wordline patterning. The boron implant is thus aligned to the edges of the transistor gates. Following the deposition of a thin offsetting dielectric layer, a low-dosage N-type implant is performed. Phosphorus is typically used for such implants. Thermal steps during the remainder of the fabrication process drive the boron atoms and phosphorus atoms into the substrate at similar rates. The desired final location of the diffusion front for the low-dosage N-type implant slightly underlaps the gate edges. The boron implant, therefore, underlaps the gate edges to a greater degree. This simple approach has several drawbacks. One drawback is that boron is implanted into both source/drain regions of the transistor. Since one of the boron-implanted source/drain regions must function as the storage node of the DRAM cell, there is a significant degradation of static refresh parameters due to the leakage of stored charge across the diode junction into the substrate. This problem is compounded by the overlap of the boron field implant and the storage node boron implant, and is particularly acute where the field edge meets the transistor gate edge.

The solutions to the above-described problem have hitherto included masking the storage node region during the boron implant or performing no boron anti-punchthrough implant at all. The problem with the first solution is that fabrication costs are increased due to the use of an additional masking step. The problem with the second solution is that capacitor leakage through the storage-node diode into the substrate is traded for capacitor leakage through the access transistor to the digit line. In addition, the absence of the boron punchthrough implant also tends to promote gate-induced diode leakage, a phenomenon that is generally not characterized as a short-channel effect.

What is needed is a new process that will eliminate the boron from the storage node junction without the use of an additional mask, which will prevent the encroachment of the field implant into the storage node junction, and which will provide both adequate field isolation and adequate punchthrough protection for short channel transistors.

SUMMARY OF THE INVENTION

This invention is a process for fabricating an NMOS or CMOS dynamic random access memory (DRAM) wherein a high-energy, oblique P-type implant is employed in a first embodiment for punchthrough protection and field isolation enhancement or in a second embodiment for punchthrough protection and as the sole field isolation implant. Optionally, a single, high-energy oblique P-type implant is employed for punchthrough protection and as the sole field isolation implant. The process proceeds by forming P-well and N-well regions in a silicon substrate, performing an field isolation implant and forming field isolation regions using LOCOS or a modified LOCOS sequence, forming a gate dielectric layer, forming wordlines (wordlines comprise portions which function as gate electrodes and other portions which function as interconnects between gate electrodes), depositing an offsetting dielectric layer, performing a low-dosage N-type implant in N-channel source/drain regions, depositing a spacer layer, performing an optional densification step, etching through the offsetting layer and the spacer layer at each storage node junction, constructing cell capacitors superjacent the storage-node regions, performing an anisotropic etch to form spacers in bitline contact regions, performing a high-energy oblique implant with a P-type dopant which penetrates the spacers and unmasked field oxide layers, performing a thermal drive-in step to diffuse the low-dosage N-type dopant and the P-type dopant, performing a high-dosage N-type implant in bitline contact regions, and performing an optional, lower energy oblique implant with an N-type implant to create a graded junction for the bitline junction region.

As a further option, the angle of P-type oblique implant is varied through a given range to create an anti-punchthrough halo having a graded density.

BRIEF DESCRIPTION OF THE DRAWINGS

FIG. 1 is a cross-sectional view of a portion of a dynamic random access memory array undergoing fabrication on a P-type substrate, at the stage where an field implant has been performed, field oxide regions have been grown, a gate dielectric layer has been formed on the substrate, and a conductive layer has been patterned to form N-channel gate electrodes;

FIG. 2 is a cross-sectional view of the memory portion of FIG. 1 following the deposition of an offsetting dielectric layer and a vertical, low-dosage N-type implant;

FIG. 3 is a cross-sectional view of the memory portion of FIG. 2 following the deposition of a spacer dielectric layer;

FIG. 4 is a cross-sectional view of the memory portion of FIG. 3 following a thermal densification step and the etching of contact openings above storage-node junction regions;

PREFERRED EMBODIMENT OF THE INVENTION

Figure 5:
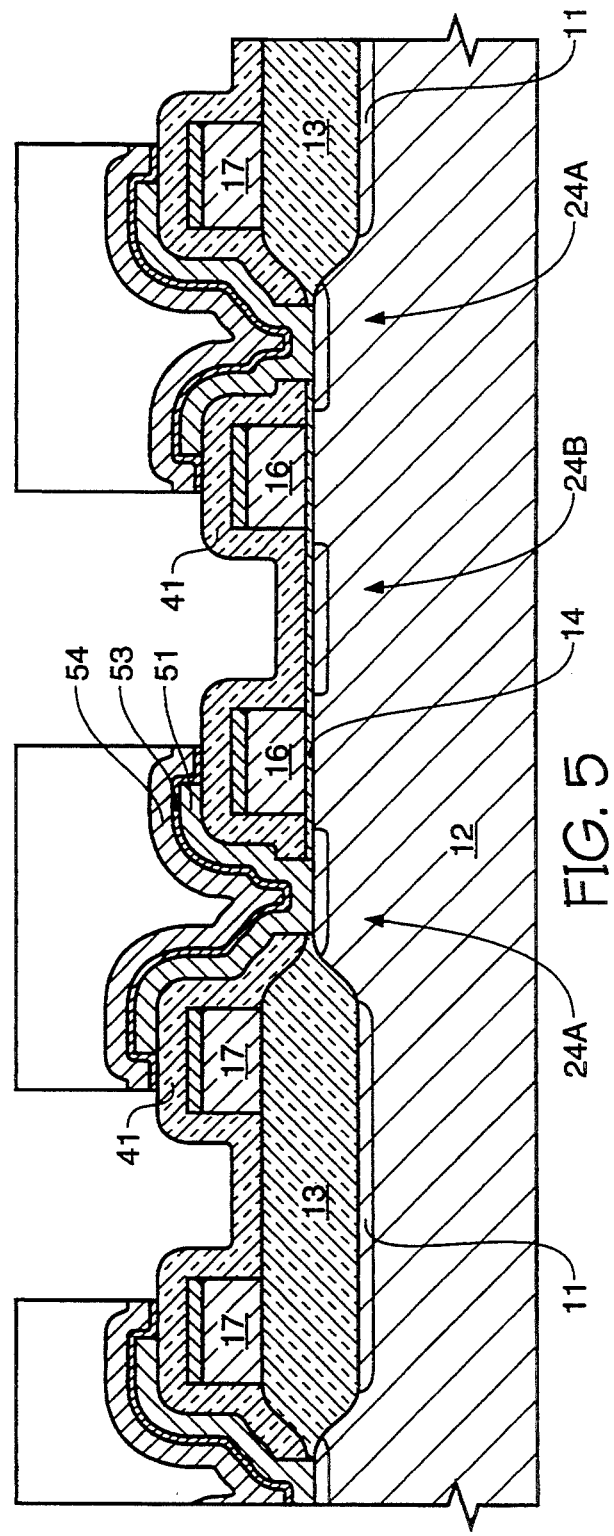
FIG. 5 is a cross-sectional view of the memory portion of FIG. 4 following the construction of a cell capacitor.

The hereinafter described process (i.e., the invention) is intended for use in dynamic random access memory (DRAM) devices. The process will be described in the context of a portion of an in-process DRAM memory cell array on a P-type substrate.

Referring now to FIG. 1, at this stage of the fabrication process, channel-stop regions 11 have been formed by an field implant into the P-type substrate 12, field oxide regions 13 have been grown using conventional local oxidation of silicon (LOCOS) or a derivative of LOCOS in an upper stratum of the substrate 12, a gate dielectric layer 14 has been formed (preferably thermally grown) on the upper surface of active areas 15 of the substrate 12, a conductive layer (preferably conductively-doped polycrystalline silicon or silicided polycrystalline silicon that is either doped or undoped) has been patterned to gate electrodes 16 and wordlines 17. In FIGS. 1–9, the polycrystalline silicon wordlines and gate electrodes are depicted as having a superjacent silicide layer 18.

Referring now to FIG. 2, an offsetting dielectric layer 21 (preferably silicon dioxide deposited via chemical vapor deposition using tetra-ethyl ortho silicate as a precursor compound) has been conformally deposited over the in-process DRAM array portion of FIG. 1. With the offsetting dielectric layer 21 in place, the in-process device is subjected to a vertical low dosage N-type (N−) implant that is aligned to the exposed surfaces of the vertical portions 22 of the offsetting dielectric layer 21 that are deposited on the sidewalls of the gate electrodes 16. Phosphorus is the preferred impurity for the low dosage N-type implant, and it is implanted at a dosage within a range of 1 to 2E13 (1 to $2 \times 10^{13}$ atoms/cm$^2$), and at an energy level within a range of 100–130 Kev. The phosphorus, that forms the N− regions 23 of the source/drain regions 24A (the memory cells' future storage-node junction regions) and 24B (the cells' future bitline contact regions) in the substrate 12, is implanted through the horizontal portions 25 of the offsetting dielectric layer 21 that directly overly the source/drain regions 24 of substrate 12.

Referring now to FIG. 3, a dielectric spacer layer 31 (preferably silicon dioxide deposited via chemical vapor deposition using tetra-ethyl ortho silicate as a precursor compound) has been conformally deposited over the in-process DRAM array portion of FIG. 2.

Referring now to FIG. 4, the in-process DRAM array portion of FIG. 3 has been subjected to a thermal densification step which has fused the offsetting dielectric layer 21 with the dielectric spacer layer 31 to form a single final spacer layer 41, and also densified the silicon dioxide of the fused layers. Following the densification step, the array is masked with a storage-node contact photomask 42, and contact openings 43 are etched through the final spacer layer 41 superjacent storage-node junction regions 24A.

Referring now to FIG. 5, a cell capacitor has been fabricated for each memory cell of the in-process DRAM array portion of FIG. 4. The bottom plate 51 of each capacitor contacts the storage node region 24A of its respective cell (when the DRAM cell capacitor is charged, the storage-node junction functions as the source region of the transistor). The cell capacitor also has a cell dielectric layer 53, and an upper capacitor plate 54.

Figure 6:
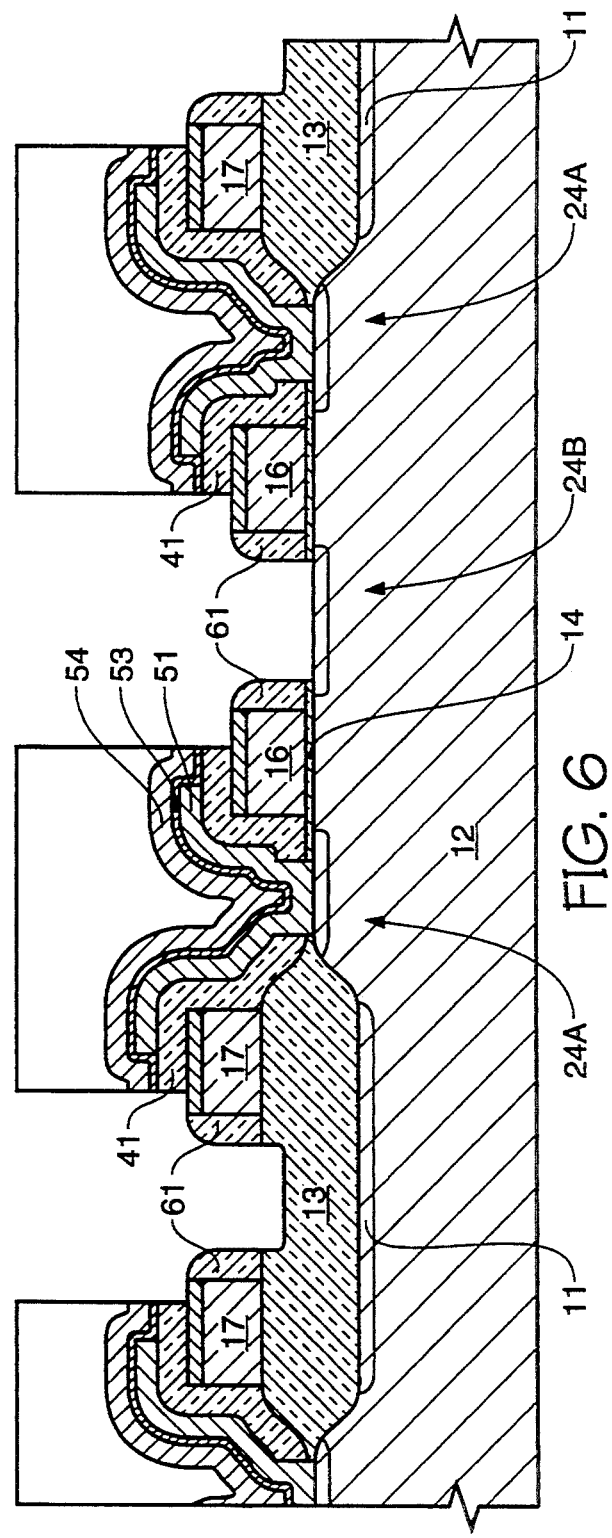
FIG. 6 is a cross-sectional view of the memory portion of FIG. 5 following an anisotropic spacer etch.

Referring now to FIG. 6, the in-process DRAM array portion of FIG. 5 has been subjected to an anisotropic spacer etch, which has created spacers 61 on the sidewalls of gate electrodes 16 in each bitline contact region 24B and on the sidewalls of wordlines 17. The anisotropic spacer etch also clears the substrate in each bitline contact region 24B.

Figure 7:
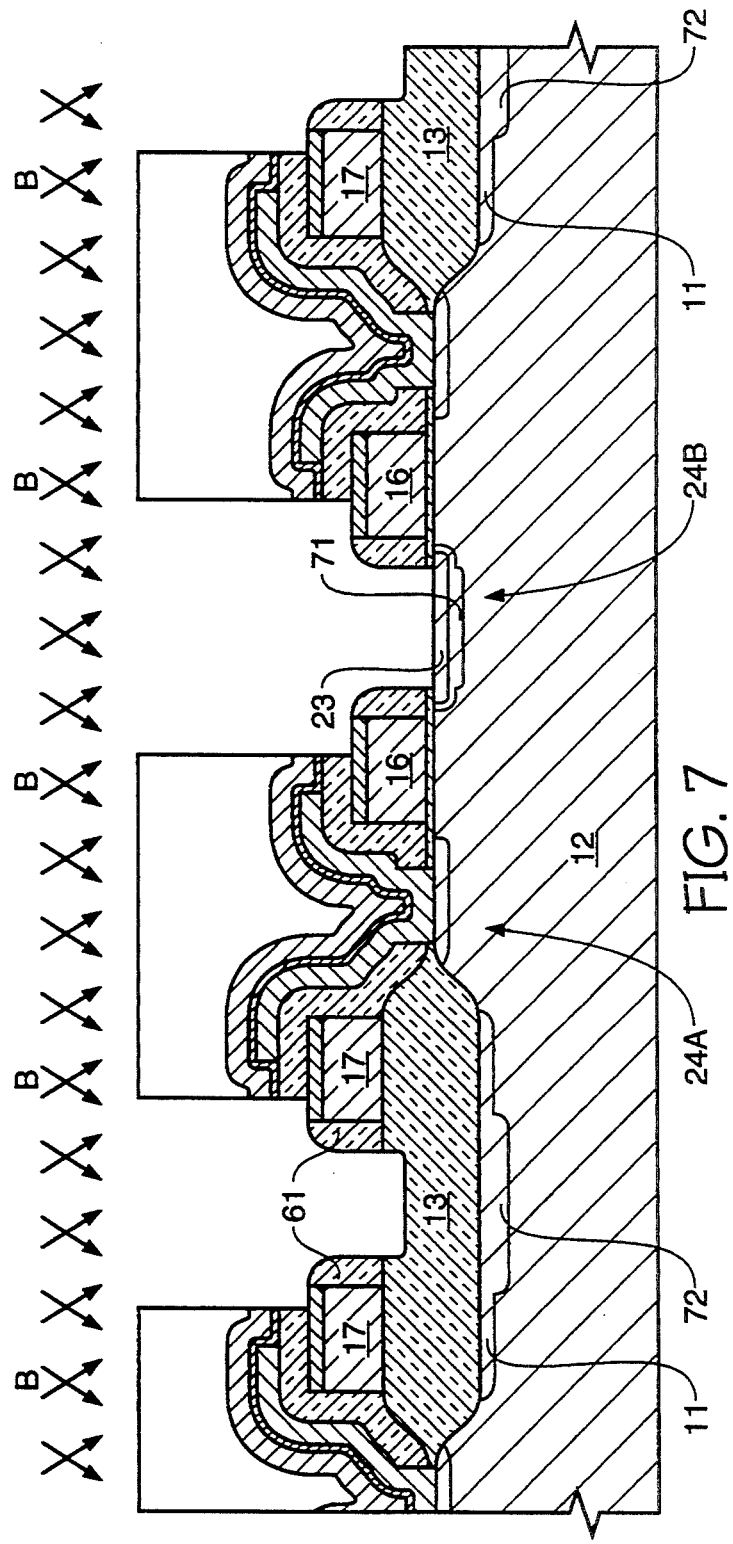
FIG. 7 is a cross-sectional view of the memory portion of FIG. 6 following an oblique implant with a P-type impurity.

Referring now to FIG. 7, the in-process DRAM array portion of FIG. 6 has been subjected to a high-energy oblique implant with a P-type impurity (dopant). The oblique P-type implant, which is preferably performed twice (the second time, after rotating the wafer 180° about its axis, is performed, ideally, such that the implanted ions are oblique to the vertical sidewalls of the wordlines and also perpendicular to the lower edge of those vertical sidewalls. The oblique P-type implant may optionally be performed a third and a fourth time at 90° rotations of the wafer from the first two times, the wafer during the third and fourth implants being rotated 180°. The oblique P-type implant serves two purposes. The first is to create anti-punchthrough regions 71, while the second is either to create a channel-stop region 72 (in the case that a field implant was not performed prior to the LOCOS oxidation step), or to enhance the already existing channel stop region 11 described heretofore. Boron is the preferred impurity for use with the oblique P-type implant, and it is implanted at a dosage within a range of 1E12 to 1E14, at an energy level within a range of 50–90 Kev, and at an preferred angle of 30 degrees from normal to the surface of the substrate 12.

Although a range of implanting angles between 25 and 45 degrees (from normal) may provide acceptable results (depending on the topography, thickness of spacers 61, and type of P-type impurity employed), implant angles toward either extreme of the stated range are likely to have diminished effectiveness. At angles too near the vertical, the oblique P-type implant is not positioned close enough to the channel to properly function an anti-punchthrough implant. At angles too near the horizontal, topography is likely to interfere with implant.

Figure 8:
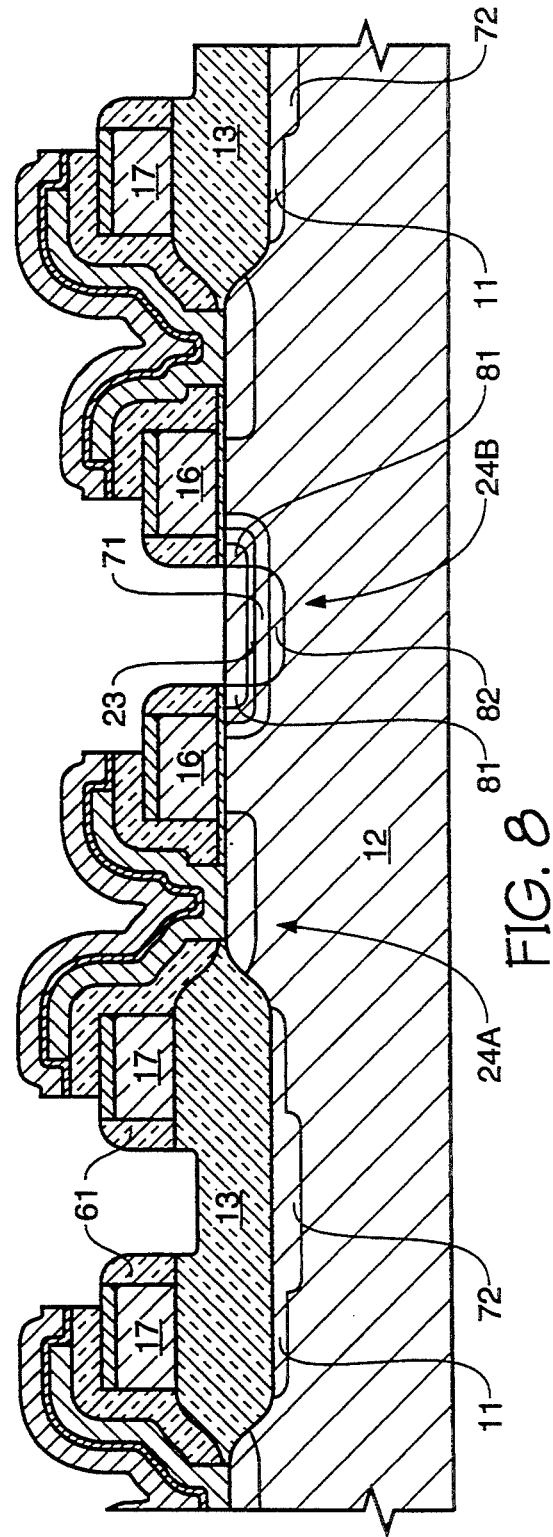
FIG. 8 is a cross-sectional view of the memory portion of FIG. 7 following a thermal drive step, an oblique implant with an N-type impurity, and a vertical, N+ arsenic implant.

Referring now to FIG. 8, the in-process DRAM array portion of FIG. 7 has been subjected to a thermal drive-in step, which causes the phosphorus of the N− implant and the boron of the oblique P-type implant to diffuse to the extent that the phosphorus dopants underlap the gate edges and the boron extends even further into the transistor channel. Following the thermal drive-in step, an optional oblique N-type implant is performed to create an obliquely implanted N-type region 81 in the bitline contact region of the cell (i.e., the drain of the transistor when the capacitor is charged). The oblique N-type implant is performed twice (the second time, after rotating the wafer 180° about its axis). Both implantations are performed such that ideally, the implanted ions are oblique to the vertical sidewalls of the wordlines and also perpendicular to the lower edge of those vertical sidewalls. Arsenic is the preferred impurity for use with the oblique N-type implant, as it has low diffusivity characteristics. The oblique N-type implant with arsenic is performed at a dosage within a range of 1E13 to 1E15, at an energy level within a range of 80–120 Kev, and at a preferred angle of 45 degrees from normal to the surface of the substrate 12. Although a range of implanting angles between 35 and 55 degrees from normal may provide an acceptable result, impurities implanted at angles much less than 55 degrees from normal may encounter topography, such as elevated field oxide regions, that will effectively block the implant. In addition, too low an implant angle will result in the obliquely implanted arsenic being implanted in the N− region, which will decrease the graded nature of the junction. At angles much above 55 degrees from normal, the effective offset decreases to the point where the oblique implant step becomes increasingly less effective. An N+ arsenic implant is then performed which creates N+ source/drain regions 82 in the bitline contact regions of the array. It should be noted that the oblique N-type implant and the N+ implants may be reversed in sequence with no change in the result.

Still referring to FIG. 8, it will be noted that the cell capacitor has protected the storage node from both the N+ implant and the oblique N-type implant. It should be pointed out that a recognized trend in DRAM fabrication is to eliminate the arsenic implants in the storage node of the DRAM cell. Not only does the presence of arsenic in the storage node junction lower sub-threshold voltage characteristics, but arsenic is a large atom, and when it is implanted through a silicon dioxide layer (in this case, the offsetting dielectric layer 21), oxygen atoms are likely to be driven from the silicon dioxide layer into the silicon lattice of the substrate 12. This phenomenon, known in the industry as oxygen "knock on", is responsible for current leakage into the substrate. High levels of leakage from the storage node degrade static refresh times.

Figure 9:
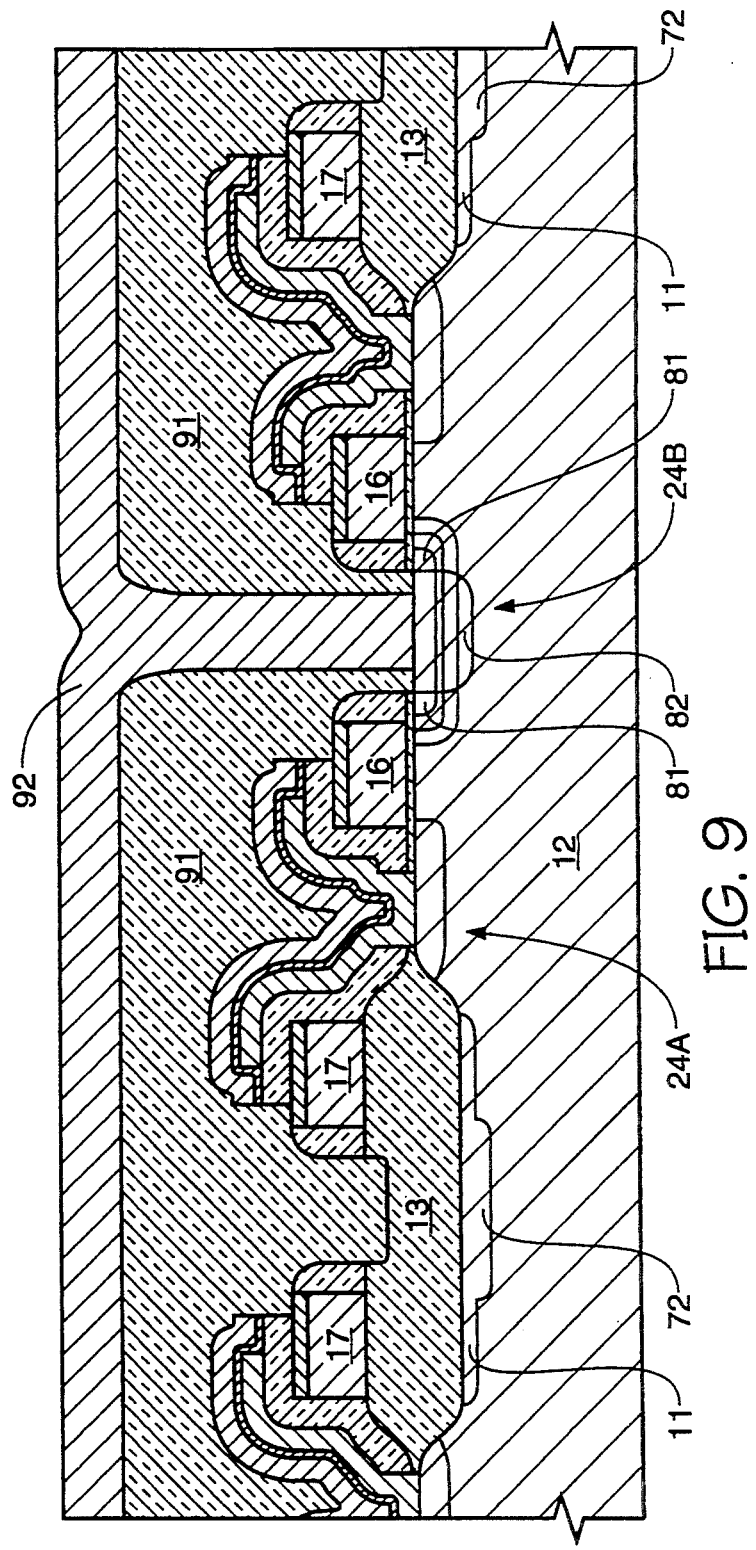
FIG. 9 is a cross-sectional view of the memory portion of FIG. 8 following the deposition of a thick dielectric layer and formation of a bitline.

Referring now to FIG. 9, the in-process DRAM array portion of FIG. 8 has been subjected to the deposition of a thick dielectric layer 91, a bitline contact etch, and the formation of a bitline 92.

Although only several embodiments of the invention are described herein, those having ordinary skill in the art will recognize that changes and modifications may be made to the process and to the structure without departing from the invention as hereinafter claimed.

What is claimed is:

1. A process for fabricating a dynamic random access memory cell array on a P-type substrate, each cell of said array having a field-effect access transistor that is insulated from neighboring access transistors by a surrounding field isolation layer, each access transistor having a first source/drain region which functions as a bitline contact region, a second source/drain region which functions as a storage node, a channel region between said first and second source/drain regions, and a gate electrode having vertical sidewalls adjacent said first and second source/drain regions, said gate electrode being dielectrically insulated from and overlying said channel region, said process comprising the following steps:

(a) depositing an offsetting dielectric layer which conformally coats said vertical sidewalls;
(b) performing a low-dosage N-type implant in N-channel source/drain regions;
(c) constructing cell capacitors superjacent the storage-node regions;
(d) forming spacers on the sidewalls of the gate electrodes;
(e) performing a high-energy oblique implant with a P-type impurity which penetrates the spacers and field oxide layers;
(f) performing a thermal drive-in step; and
(g) performing a high-dosage N-type source/drain implant in bitline contact regions.

2. The process of claim 1, wherein the impurity for the high-energy oblique P-type implant is boron.

3. The process of claim 2, wherein the high-energy oblique P-type implant is performed with an energy of 50 to 90 Kev and at a dosage level of 1E12 to 1E14.

4. The process of claim 3, wherein the high-energy oblique P-type implant is performed at an incident angle within a range of 25 to 45 degrees from normal to the substrate.

5. The process of claim 4, wherein each transistor gate comprises a portion of a wordline which traverses the array, each wordline having a pair of lateral edges, and the oblique P-type implant is performed by implanting P-type ions obliquely in two directions, each of said directions being oriented such that the P-type ions are implanted in the substrate beneath a lateral edge on each side of the wordline.

6. The process of claim 1, wherein an oblique implant is performed with an N-type impurity to create a graded junction for the bitline contact region between step (f) and step (g).

7. The process of claim 6, wherein the oblique N-type implant impurity is arsenic.

8. The process of claim 7, wherein the oblique N-type implant is performed at an energy of 80 to 120 Kev and at a dosage of within a range of 1E13 to 1E15.

9. The process of claim 8, wherein the oblique N-type implant is performed at an angle within a range of 35 to 55 degrees from normal to the substrate.

10. The process of claim 9, wherein each transistor gate comprises a portion of a wordline which traverses the array, each wordline having a pair of lateral edges, and the oblique P-type implant is performed by implanting P-type ions obliquely in two directions, each of said directions being oriented such that the P-type ions are implanted in the substrate beneath a lateral edge on each side of the wordline.

11. The process of claim 1, wherein an oblique implant is performed with an N-type impurity to create a graded junction for the bitline contact region following step (g).

12. The process of claim 11, wherein the oblique N-type implant impurity is arsenic.

13. The process of claim 12, wherein the oblique N-type implant is performed at an energy of 80 to 120 Kev and at a dosage of within a range of 1E13 to 1E15.

14. The process of claim 13, wherein the oblique N-type implant is performed at an angle within a range of 35 to 55 degrees from normal to the substrate.

15. The process of claim 14, wherein each transistor gate comprises a portion of a wordline which traverses the array, each wordline having a pair of lateral edges, and the oblique P-type implant is performed by implanting P-type ions obliquely in two directions, each of said directions being oriented such that the P-type ions are implanted in the substrate beneath a lateral edge on each side of the wordline.

* * * * *